US007062661B1

(12) United States Patent
Na

(10) Patent No.: US 7,062,661 B1
(45) Date of Patent: Jun. 13, 2006

(54) METHOD FOR CONTROLLING A POWER SUPPLY IN AN EXTERNAL TERMINAL CONNECTION OF A PERSONAL DATA ASSISTANT

(75) Inventor: Seong-Wuk Na, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/124,052

(22) Filed: Jul. 29, 1998

(30) Foreign Application Priority Data

Aug. 29, 1997 (KR) ................. 1997-42735

(51) Int. Cl.
*G06F 1/26* (2006.01)
*G06F 1/28* (2006.01)
*G06F 1/30* (2006.01)

(52) U.S. Cl. .............. 713/300; 713/323; 324/429; 340/539; 455/403

(58) Field of Classification Search ............. 713/300, 713/323; 340/539; 324/429; 429/23; 718/109
See application file for complete search history.

(56) References Cited

U.S. PATENT DOCUMENTS

| 5,159,272 A | * | 10/1992 | Rao et al. ............... 324/429 |
| 5,187,425 A | * | 2/1993 | Tanikawa ............... 320/31 |
| 5,307,003 A | * | 4/1994 | Farbanks et al. ........ 323/222 |
| 5,497,339 A | * | 3/1996 | Bernard ............... 708/109 |
| 5,510,690 A | * | 4/1996 | Tanaka et al. ............ 320/2 |
| 5,560,021 A | * | 9/1996 | Vook et al. ............ 713/323 |
| 5,568,370 A | * | 10/1996 | Goldstein et al. ......... 363/34 |
| 5,600,841 A | * | 2/1997 | Culbert ............... 713/300 |
| 5,625,673 A | * | 4/1997 | Grewe et al. ............ 379/61 |
| 5,708,816 A | * | 1/1998 | Culbert ............... 713/300 |
| 5,714,932 A | * | 2/1998 | Castellon et al. ........ 340/539 |
| 5,797,089 A | * | 8/1998 | Nguyen ............... 455/403 |
| 5,801,585 A | * | 9/1998 | Roohparvar ............ 327/544 |
| 5,903,764 A | * | 5/1999 | Shyr et al. ............ 713/300 |
| 6,041,374 A | * | 3/2000 | Postman et al. ......... 710/73 |

* cited by examiner

*Primary Examiner*—Frantz B. Jean
(74) *Attorney, Agent, or Firm*—Sughrue Mion, PLLC

(57) ABSTRACT

A power management method for a PDA (personal digital assistant) which can be connected with an external communication terminal is described. Upon detecting power-on of the external communication terminal, the PDA detects a battery voltage of the PDA and compares the battery voltage with a reference voltage which is slightly higher than an inoperable voltage of the PDA. If the battery voltage is lower than the reference voltage, the PDA generates a low-voltage alarm message. Otherwise, if the battery voltage is higher than the reference voltage, the PDA supplies electric power to the external communication terminal.

9 Claims, 2 Drawing Sheets

METHOD FOR CONTROLLING A POWER SUPPLY IN AN EXTERNAL TERMINAL CONNECTION OF A PERSONAL DATA ASSISTANT

BACKGROUND OF THE INVENTION

1. Field of the Invention

The present invention relates to a personal digital assistant, and in particular, to a power management method for a personal digital assistant which can be connected to an external communication terminal.

2. Description of the Related Art

A personal digital assistant (hereinafter referred to as PDA) is a multimedia device which allows one to access desired information in a desired form anytime and anywhere. The PDA has various utilities according to the user. For instance, the PDA has a personal information management (PIM) function for managing an address book, a telephone directory, a personal scheduler and memorandum. The PDA also has an additional function for gathering and exchanging information by way of facsimile or personal computer (PC) communications. Recently, the PDA may also be connected with an external communication terminal, such as a portable radio telephone. If necessary, the PDA and portable radio telephone may be unified into one body.

When the external communication terminal and the PDA are unified, the PDA may become overloaded due to lack of power supply voltage. Therefore, there has been a demand for a PDA capable of preventing the overload, even in the case where the external communication terminal is connected to the PDA.

SUMMARY OF THE INVENTION

It is therefore an object of the present invention to provide a power management method for preventing overload of a personal digital assistant which is connectable with an external communication terminal.

To achieve the above object, there is provided a power management method for a PDA (personal digital assistant) which can be connected to an external communication terminal. Upon detecting power-on of the external communication terminal, the PDA detects a battery voltage of the PDA and compares the battery voltage with a reference voltage which is slightly higher than an inoperable voltage threshold of the PDA. If the battery voltage is lower than the reference voltage, the PDA generates a low-voltage alarm message. Otherwise, if the battery voltage is higher than the reference voltage, the PDA makes a second voltage comparison between a) the difference between the battery voltage and the power required for the external communication terminal and b) the inoperable voltage threshold of the PDA. If the difference indicated in a) is larger than the voltage of b), the PDA supplies electric power to the external communication terminal.

BRIEF DESCRIPTION OF THE DRAWINGS

The above objects and other advantages of the present invention will become more apparent by describing the preferred embodiment of the present invention with reference to the attached drawings, in which.

DETAILED DESCRIPTION OF THE PREFERRED EMBODIMENT

A preferred embodiment of the present invention will be described in detail hereinbelow with reference to the accompanying drawings. To provide a comprehensive description of the present invention, the present invention will be illustratively described, confined to the specific embodiment, but the invention is not limited thereto. Furthermore, it should be noted that the present invention can be implemented by anyone skilled in the art with the following general description. In the description, well-known functions or constructions are not described in detail to avoid obscuring the invention.

Figure 1:
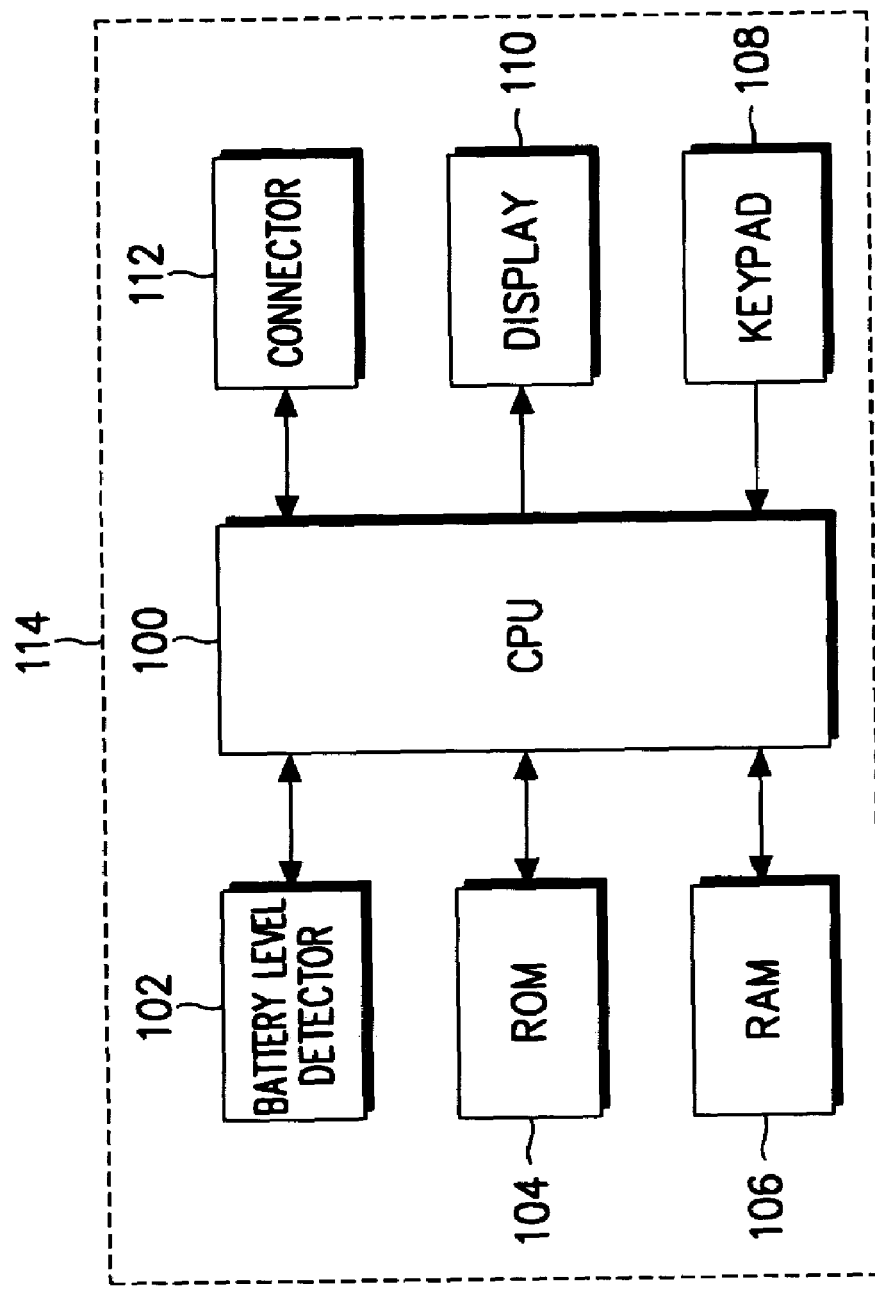
FIG. 1 is a schematic block diagram of a personal digital assistant (PDA) which can be connected to an external communication terminal.

Referring to FIG. 1, a PDA 114 includes a central processing unit (CPU) 100 for controlling an overall operation of the PDA 114 according to a control program stored in a ROM (Read Only Memory) 104. The ROM 104 stores the control program of the CPU 100, data representative of a voltage drop according to the power consumption of an external communication terminal connected to the PDA 114, and various reference data (e.g., data indicative of an inoperable voltage Vi of the PDA). A RAM (Random Access Memory) 106 temporarily stores data generated in the process of executing the control program by the CPU 100. A keypad 108 includes a plurality of numeric and function keys for generating key data to the CPU according to a key operation supplied by the user. A display 110 displays the operational status of the PDA 114 under the control of the CPU 100. A connector 112 consists of a serial port to connect the PDA 114 to the external communication terminal, and interfaces various data and control signals with the external communication terminal under the control of the CPU 100. A battery level detector 102 detects a voltage level of a battery (not shown) of the PDA 114 under the control of the CPU 100.

Figure 2:
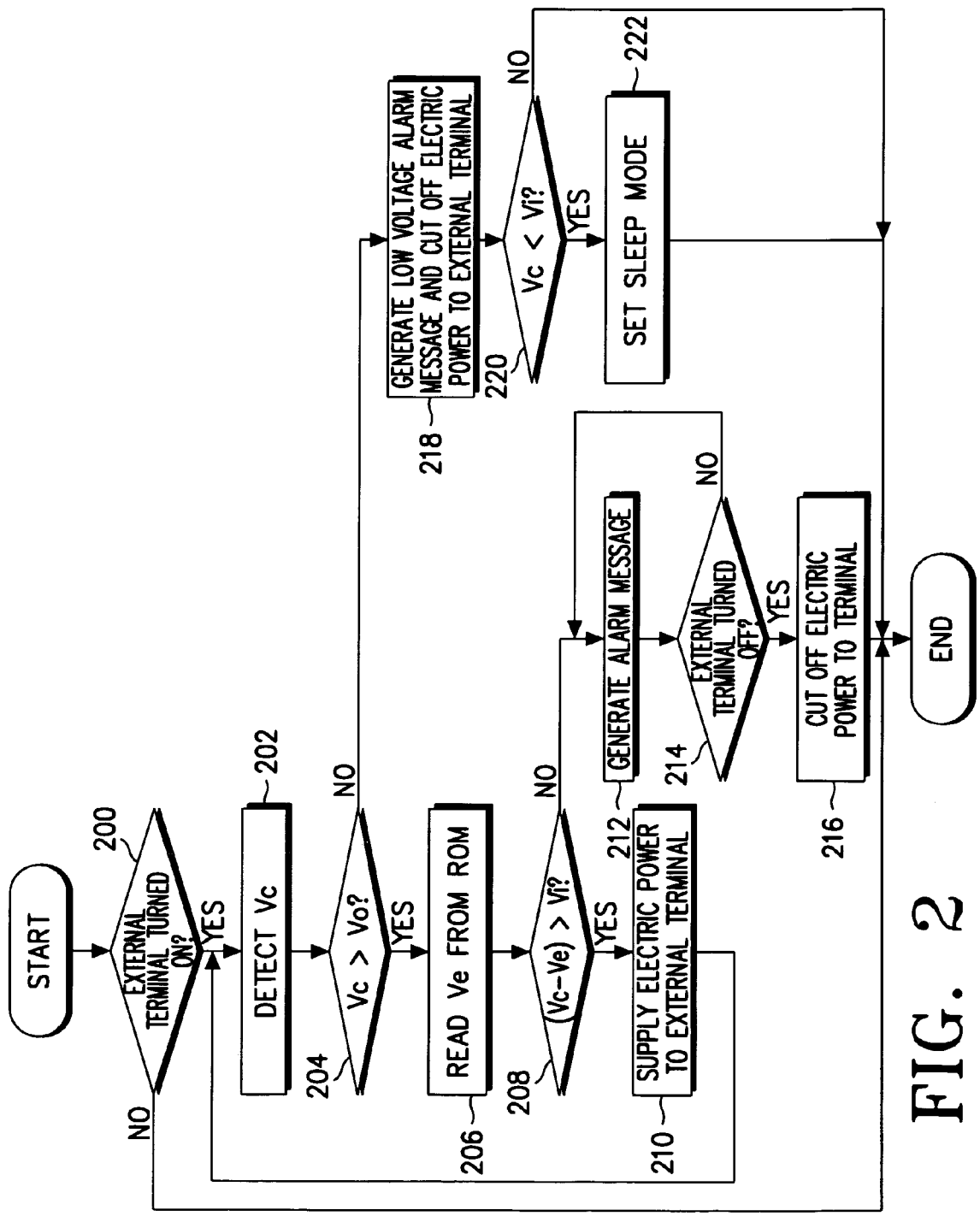
FIG. 2 is a flowchart for managing power of the PDA shown in FIG. 1 according to a preferred embodiment of the present invention.

FIG. 2 shows a flowchart for managing the power of the PDA 114. Generally, the CPU 100 detects a voltage difference between a battery voltage Vc and a voltage drop Ve according to the power consumption of the external communication terminal. The CPU cuts off the electric power to the external communication terminal if the voltage difference is lower than the inoperable voltage threshold Vi of the PDA 114. The control flow of FIG. 2 is programmed into the ROM 104 and executed by the CPU 100.

Now, referring to FIGS. 1 and 2, if the user turns on the external communication terminal connected to the PDA 114 at step 200, the CPU 100 of the PDA 114 proceeds to step 202 to detect the battery voltage Vc by virtue of the battery level detector 102. The CPU 100 checks, at step 204, whether the battery voltage Vc is higher than a first reference voltage Vo indicative of an alarm generation voltage. The alarm generation voltage Vo is a voltage slightly higher than a threshold voltage at which the PDA 114 cannot operate normally. The alarm generation voltage Vo can be properly set according to various operating conditions of the PDA 114. If the battery voltage Vc is lower than the alarm generation voltage Vo, the CPU 100 proceeds to step 218 to generate a low-voltage alarm message through the display 110 or a speaker (not shown) and to cut off electric power to the external terminal. Thereafter, the CPU 100 checks, at step 220, whether the battery voltage Vc is lower than the inoperable voltage Vi at which the PDA 114 cannot operate normally. If the battery voltage Vc of the PDA 114 is higher than the inoperable voltage Vi, the CPU 100 ends this process. However, if the battery voltage Vc of the PDA 114 is lower than the inoperable voltage Vi, the CPU 100 sets the PDA 114 to a sleep mode in step 222. In the sleep mode, every part of the PDA 114 is inactive other than particular functions of the CPU 100, such as a power-on/off function.

However, if the battery voltage Vc is higher than the alarm generation voltage Vo at step 204, the CPU 100 proceeds to step 206 to read, from the ROM 104, a voltage drop Ve corresponding to the power consumption, or voltage drop, of the external communication terminal. The ROM 104 previously stores data corresponding to the voltage drops Ve of respective external communication terminals to be connected to the PDA 114. The CPU 100 checks, at step 208, whether a voltage difference (Vc–Ve) between the battery voltage Vc and the voltage drop Ve is higher than the inoperable voltage threshold Vi of the PDA. If the voltage difference is lower than the inoperable voltage Vi, the CPU 100 proceeds to step 212 to generate an alarm message informing the user that it is impossible to power on the external communication terminal connected to the PDA 114. Subsequently, the CPU 100 checks, at step 214, whether the external communication terminal is powered off. If it is not powered off, the CPU 100 returns to step 212 to repeat the steps 212 and 214 until the user powers off the external communication terminal. If the external communication terminal is powered off at the step 214, the CPU 100 cuts off the electric power to the external communication terminal at step 216. However, if the voltage difference (Vc–Ve) is higher than the inoperable voltage Vi, the CPU 100 proceeds to step 210 to supply electric power to the external communication terminal and then, returns to step 202. In this way, the PDA according to the present invention can prevent the overload of the battery.

Although an illustrative embodiment of the present invention has been described herein with reference to the accompanying drawings, it is to be understood that the invention is not limited to the precise embodiment so disclosed. Various other changes and modifications may be effected by one skilled in the art without departing from the scope or spirit of the invention.

What is claimed is:

1. A power management method for a personal digital assistant which can be connected with an external communication terminal, comprising the steps of:
   upon detecting power-on of said external communication terminal, detecting a battery voltage of said personal digital assistant;
   comparing said battery voltage with a reference voltage, said reference voltage being slightly higher than an inoperable voltage of said personal digital assistant;
   generating a low-voltage alarm message when said battery voltage is lower than said reference voltage; and
   supplying electric power to said external communication terminal, if said battery voltage is higher than said reference voltage.

2. The method as claimed in claim 1, wherein said alarm message is generated through at least one of a display and a speaker.

3. The method as claimed in claim 1, wherein a supply ability of the battery is defined as a difference between a current battery voltage and an inoperable voltage of said personal digital assistant.

4. The method as claimed in claim 3, wherein said alarm message is generated through at least one of a display and a speaker.

5. A power management method for a personal digital assistant which can be connected with an external communication terminal, comprising the steps of:
   upon detecting power-on of said external communication terminal, detecting a battery voltage of said personal digital assistant;
   comparing said battery voltage with a reference voltage, said reference voltage being slightly higher than an inoperable voltage of said personal digital assistant;
   generating a low-voltage alarm message when said battery voltage is lower than said reference voltage;
   supplying electric power to said external communication terminal if said battery voltage is higher than said reference voltage,
   comparing said battery voltage with an inoperable voltage threshold of said personal digital assistant; and
   setting the personal digital assistant to a sleep mode when said battery voltage is lower than said inoperable voltage threshold of said personal digital assistant.

6. A power management method for a personal digital assistant which can be connected with an external communication terminal, comprising the steps of:
   upon detecting power-on of said external communication terminal, detecting a battery supply ability of said personal digital assistant;
   calculating a difference between said battery supply ability and a power consumption of said external communication terminal;
   comparing said difference with an inoperable threshold value at which said personal digital assistant cannot operate normally;
   providing electric power to said external communication terminal when said difference is higher than said inoperable threshold value.

7. The method as claimed in claim 6, wherein the inoperable threshold value is an inoperable voltage of the personal digital assistant.

8. The method as claimed in claim 6, further comprising the step of:
   repeatedly generating an alarm message informing a user that a battery voltage is insufficient to normally activate said external communication terminal when said difference voltage is lower than said inoperable voltage threshold, until said external communication terminal is turned off.

9. The method as claimed in claim 6, wherein a voltage drop according to the power consumption of said external communication terminal is previously tabled in a ROM of the personal digital assistant.

* * * * *